United States Patent
Fischer

(10) Patent No.: US 6,463,359 B2
(45) Date of Patent: Oct. 8, 2002

(54) MICRO-ALIGNMENT PICK-UP HEAD

(75) Inventor: Ernest H. Fischer, Seedorf (CH)

(73) Assignee: Infotech AG, Solothurn (CH)

( * ) Notice: Subject to any disclaimer, the term of this patent is extended or adjusted under 35 U.S.C. 154(b) by 0 days.

(21) Appl. No.: 09/789,898

(22) Filed: Feb. 20, 2001

(65) Prior Publication Data

US 2002/0116090 A1 Aug. 22, 2002

(51) Int. Cl.⁷ .............................................. G05B 19/04
(52) U.S. Cl. ..................... 700/254; 700/254; 700/249; 29/792; 29/799; 29/705; 156/217; 156/256; 156/258; 156/443; 901/30
(58) Field of Search ............................... 700/245, 249, 700/254; 29/792, 799, 705; 156/217, 256, 258, 443; 901/30

(56) References Cited

U.S. PATENT DOCUMENTS

| | | | |
|---|---|---|---|
| 4,613,942 A | 9/1986 | Chen | 364/513 |
| 4,675,993 A | 1/1987 | Harada | 29/740 |
| 4,668,095 A | 5/1987 | Maeda | 356/400 |
| 4,818,993 A | 4/1989 | Stockel | 340/825 |
| 4,890,241 A | 12/1989 | Hoffman et al. | 364/513 |
| 4,968,369 A * | 11/1990 | Darcy et al. | 156/217 |
| 5,195,234 A | 3/1993 | Pine et al. | 29/720 |
| 5,483,440 A | 1/1996 | Aono et al. | 364/167 |
| 5,515,599 A * | 5/1996 | Best | 29/705 |
| 5,551,734 A * | 9/1996 | Sulzyc et al. | 258/148.15 |
| 5,588,109 A | 12/1996 | Dickinson et al. | 395/326 |
| 5,701,661 A | 12/1997 | Van den Brink | 29/721 |
| 5,768,759 A | 6/1998 | Hudson | 29/407 |
| 5,768,768 A * | 6/1998 | Best | 29/792 |
| 5,805,442 A | 9/1998 | Crater et al. | 364/138 |
| 5,821,994 A | 10/1998 | Tani | 348/207 |
| 5,903,662 A | 5/1999 | De Carlo | 382/151 |
| 6,216,473 B1 * | 3/2001 | Aril | 062/77 |

FOREIGN PATENT DOCUMENTS

| | | | |
|---|---|---|---|
| DK | 0 449 481 A1 | 11/1993 | G06F/13/10 |
| DK | 42 16 242 A 1 | 11/1993 | G06F/13/10 |
| DK | 296 15 180 U 1 | 12/1996 | H03K/17/945 |

(List continued on next page.)

OTHER PUBLICATIONS

New Product Introductions—Fabtech 2001, See Grippers and rotary actuators, Internet.*
Universal, Generalsurfacemount application machine GSMs 5681A, 1999, Internet, pp. 1–E–59.*
Baartman et al., "Using coarse/Fine Manipulation With Vision To Place Fine Pitch SMD Components", 1989, IEEE, IEEE Symposium, pp. 262–266.
A copy of the International Search Report International App. No. PCT/US01/07586 META–007PCT is enclosed 8 pages.
A copy of the International Search Report International App. No.: PCT/US01/07587 META–003PCT is enclosed 4 pages.
A copy of the International Search Report International App. No.: PCT/US01/07236 META–004PCT is enclosed 4 pages.

(List continued on next page.)

Primary Examiner—William A. Cuchlinski, Jr.
Assistant Examiner—McDieunel Marc
(74) Attorney, Agent, or Firm—Thelen Reid & Priest LLP; David B. Ritchie

(57) ABSTRACT

A placement robot includes a micro alignment pick-up head (MAP) to hold a component for placement on a substrate. The MAP includes a retention member that may be a vacuum pick-up nozzle for component retention and has two main parts: an upper body and a lower body. The upper body and the lower body are separated from one another by an air bearing which provides near-frictionless performance and allows the lower body a range of motion relative to the upper body. The MAP is either "attached" or "loose." Micropositioning actuators provide fine positioning in the X and/or Y directions.

36 Claims, 9 Drawing Sheets

FOREIGN PATENT DOCUMENTS

| | | | | |
|---|---|---|---|---|
| DK | 196 42 737 A1 | 10/1997 | ........... | B60R/16/02 |
| DK | 196 49 082 | 1/1998 | .............. | B25J/3/04 |
| EP | 275992 A2 | 1/1988 | ......... | G05B/19/417 |
| EP | 0 430 467 | 8/1990 | ........... | B23P/19/00 |
| EP | 0 449 481 A1 | 10/1991 | .......... | H05K/13/04 |
| EP | 0 476 851 A2 | 3/1992 | .......... | H05K/13/04 |
| EP | 0 777 263 A2 | 6/1997 | ........... | H01L/21/00 |
| EP | 0 825 506 A2 | 2/1998 | ........ | G05B/19/418 |
| EP | 0 932 103 A1 | 7/1999 | ........... | G06F/13/10 |
| FR | 2 506 195 | 11/1982 | ........... | B23P/19/00 |
| GB | 2 257 538 A | 1/1993 | ........... | G05B/19/02 |
| JP | 01016336 | 1/1989 | ........... | B23P/19/02 |
| JP | 01103239 | 4/1989 | ........... | B23P/19/02 |
| WO | 89/04578 | 5/1989 | ........... | H04Q/3/00 |
| WO | 95/30964 | 11/1995 | ........... | G06K/9/00 |
| WO | 99/48276 | 9/1999 | ............ | H04N/1/00 |
| WO | 00/04428 | 1/2000 | ......... | G05B/19/042 |
| WO | 00/08588 | 2/2000 | | |

OTHER PUBLICATIONS

A copy of the International Search Report International App. No.: PCT/IB01/00453 INFO–002PCT is enclosed 4 pages.

Patent Abstracts of Japan, Publication No. 11355625, Publication Date Dec. 24, 1999, App. No. 10158852, Inv. Kobayashi Tsutomu.

Smith et al., "CyberCut: A World Wide Web Based Design–to–Fabrication Tool", pp. 432–442, Journal of Manufacturing Systems vol. 15/No. 6 1996.

* cited by examiner

MICRO-ALIGNMENT PICK-UP HEAD

FIELD OF THE INVENTION

The present invention is related to the alignment and registration of components onto substrates in a machine placement environment. More particularly, the present invention is directed to a method for utilizing a high-resolution placement head in conjunction with a relatively low-resolution placement system to obtain high-resolution placement of components onto substrates.

BACKGROUND OF THE INVENTION

Robotic placement systems (robots) are used widely throughout industry. For example, they are used to place electronic components on printed circuit boards (PCBs) in the electronics assembly industry, they are used to build automobiles and other mechanical equipment, they are used in biotechnology to place samples in test cells and to efficiently process experiments. Most robotic placement systems provide at least four axes of control: the X- and Y-axes defining the horizontal plane, the Z or vertical axis, and the T or rotational axis.

The robot's Z-axis that can move up and down often holds a tool, gripper, magnet or vacuum nozzle which can acquire components. This is often referred to as a pick-up head. While a component is mounted to the pick-up head, several process steps can be performed on the component before the component is released. Generally, the cost of a robot axis is highly influenced by the positioning accuracy and positioning repeatability required of the axis. A highly accurate axis is generally much more expensive than a less accurate axis. In the past, the accuracy of a robot axis had to be much more accurate than the accuracy requirement for a particular process to be performed by the axis. If, for example, a placement process has to be accurate to within +/−20 microns, the robot's axis position accuracy must generally be about ten times greater, i.e., +/−2 microns. Such accuracy requirements result in extremely expensive equipment. To achieve an axis with a positional accuracy of +/−2 microns, air-type bearings fabricated out of ceramic components are often required, particularly for large spans used in robotic assembly equipment in the electronics industry. The larger such bearings are, the more they cost. It would, accordingly, be highly desirable to provide a way to avoid this high cost while achieving desired high accuracy placement by other means.

BRIEF DESCRIPTION OF THE INVENTION

A placement robot having a given positional resolution accuracy (e.g., in the X and/or Y directions of a horizontal plane) positions a component for placement at a selected location on a target substrate by placing it at a first position displaced in the Z (vertical) direction over the target substrate disposed within a first resolution accuracy (in X and/or Y directions) of the selected location. A micro alignment pick-up head (MAP) holds the component. The MAP includes a retention member that may be a vacuum pick-up nozzle for component retention and has two main parts: an upper body and a lower body. The upper body and the lower body are separated from one another by an air bearing which provides near-frictionless performance and allows the lower body a range of motion relative to the upper body. A pressurized gas line to the MAP provides pressurized air to the air bearing. The nozzle with the component attached therefore has a range of motion within the air bearing which exceeds the positional resolution accuracy of the basic placement robot. The MAP may be in one of two states. The first state is referred to as the "attached" state. In this state the air bearing is disabled, as by inverting the pressure on the air bearing to vacuum, and the upper body and lower body are therefore locked together and move as one. The second state is the "loose" state. In this state the air bearing is active and the pick-up head nozzle may be moved freely with no appreciable friction. Micropositioning actuators may be coupled to the MAP's upper body to contact the lower body so as to provide fine positioning in the X and/or Y directions. Alternately, by leaving the lower body in the "loose" state, the lower body may be brought into accurate alignment as by the application of surface tension forces applied by melting solder, or by other suitable means. Accordingly, once initially positioned within a first resolution accuracy of the selected location, additional positioning may be performed to bring the component to within a second resolution accuracy of the selected location, the second resolution accuracy being less than the first resolution accuracy. Once thus positioned, the component may be brought toward or into contact with the substrate, as desired, by activation of the Z-axis actuator in a conventional manner.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
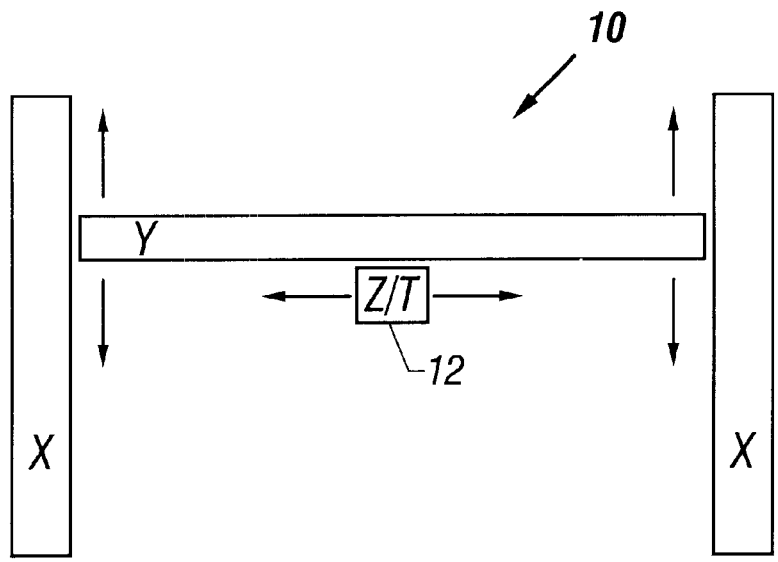
FIG. 1 is a system block diagram of an X, Y, Z, T positioning system in accordance with the prior art.

Embodiments of the present invention are described herein in the context of a micro-alignment pick-up head. Those of ordinary skill in the art will realize that the following detailed description of the present invention is illustrative only and is not intended to be in any way limiting. Other embodiments of the present invention will readily suggest themselves to such skilled persons having the benefit of this disclosure. For example, it is not a requirement of the invention that the retention member of the pick-up head operate by vacuum force. It may operate in any conventional manner, including magnetic pick-up, gripper pick-up, and the like. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, certain components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

In the automation industry robots are widely used to perform processes on components. Any type of robot can be used with the present invention. For example, a single linear axis robot, a Scara robot and a Cartesian X/Y system may all be used, as can other systems designed to position a component relative to a substrate with a given positional accuracy.

In most cases, a robot is equipped with a Z-axis, carrying a tool. Often the tool may be rotated about the Z-axis in the T direction. At the tool various nozzles or grippers can be mounted to perform processes on attached components. The micro-alignment pick-up head (MAP) of the present invention may be mounted on any automation handling system that supports a Z-axis. The MAP, by way of example and not limitation, can be used in the: electronics industry for SMT (surface mount technology) repair, component assembly, printed circuit board (PCB) assembly, test and reflow; semiconductor industry for chip assembly including flip chip, micro-BGA (ball grid array) and balling; optics/photonics industry for micro optics assembly, optics handling, optical elements packaging; mechanics industry for micro assembly, material handling and component packaging; biotechnology industry for pharmaceutical production, liquid handling applications, genetic screening, assay handling and research applications.

Turning now to FIG. 1, a system block diagram of a placement machine 10 is illustrated. The placement machine 10 positions a Z/T stage 12 in X and Y directions by moving the Z/T stage 12 along positional axis Y and moving positional axis Y between rails X which define the X-axis. Such systems are well known to those of ordinary skill in the art and can be built to various positional resolution accuracies, that is, if one wants to position a particularly sized object held by the Z/T stage to within a given range of distance, say +/−20 microns, those of ordinary skill in the art know how to build such systems.

Figure 2:
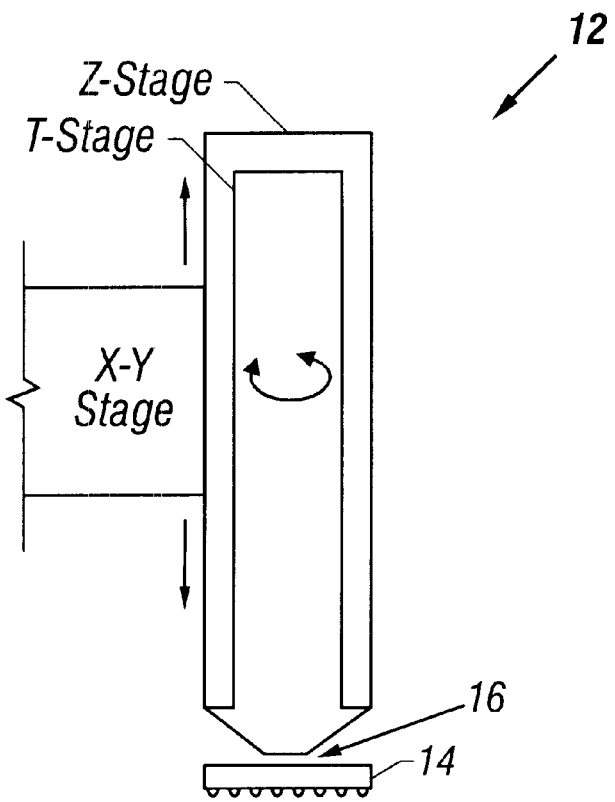
FIG. 2 is a schematic diagram of a Z/T positioning stage of an X, Y, Z, T positioning system in accordance with the prior art.

Turning now to FIG. 2, a schematic diagram of a Z/T positioning stage 12 of an X, Y, Z, T positioning system in accordance with the prior art is shown. The Z/T positioning stage holds a component 14 with a gripper 16 which can be a mechanical gripper, a vacuum gripper nozzle, or the like. The Z-stage includes a motor or actuator to positioning the stage along the vertical axis. The T-stage includes a motor or actuator to rotationally position the component. Thus, the X–Y stages position a component over a selected location of a substrate, the T-stage adjusts the orientation of the component for rotational position, and the Z-stage allows the component to be raised and lowered and, ultimately allows the component to be placed down on the substrate at a position within the positional resolution accuracy of the X–Y stage. Such systems, as discussed before, are well within the skill of those of ordinary skill in the art.

Figure 3:
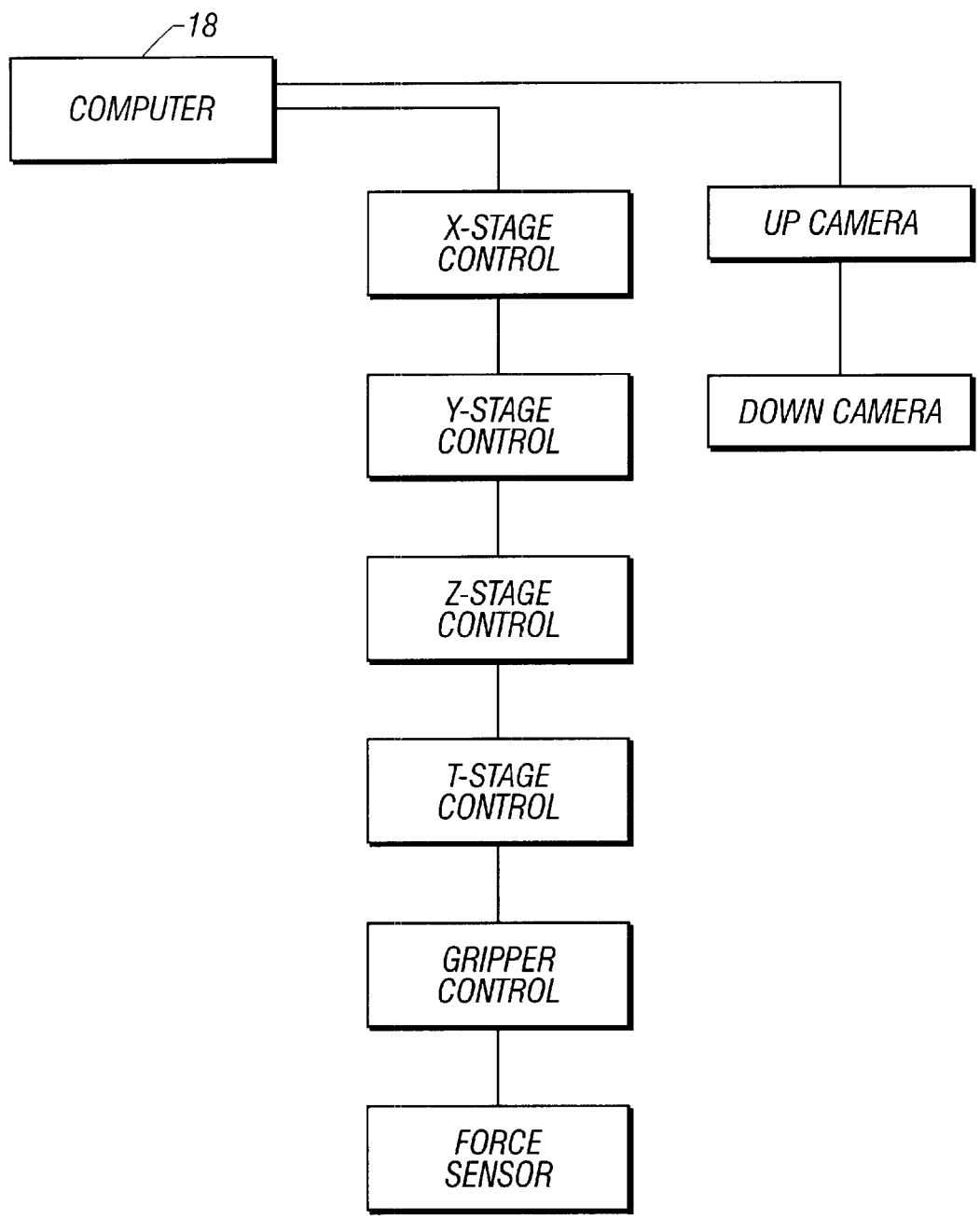
FIG. 3 is a system block diagram of a computer control system for an X, Y, Z, T positioning system in accordance with the prior art.

Turning now to FIG. 3, a system block diagram of a computer control system for an X, Y, Z, T positioning system in accordance with the prior art is shown. Such systems include a computer 18 that may be of any suitable type, such as a microprocessor, digital signal processor, and the like. Computer 18 may be distributed among several locations or located at a central site. Computer 18 receives inputs from position detectors associated with the various stages and provides outputs to actuators controlling the various stages. It also controls the component pick-up gripper and reads an output from a force sensor, if present, to determine the amount of force being applied to the pick-up head in compression against the substrate. Computer 18 (or a separate system in communication with computer 18) also reads inputs from one or more machine vision system cameras (or similar devices) that image the component and the substrate to assist in accurate placement of a component to the substrate. Generally such systems include a camera mounted on the bed of the placement machine having its associated optics oriented so as to look up at the bottom surface or a side of the component and thereby determine its X, Y and T orientation. Such systems usually have a camera mounted with the pick-up head on the Z/T stage that can image the substrate from the pick-up head and determine its relative location. Other schemes exist for imaging including one-camera systems, laser shadow imagers, and the like. Such machine vision systems are all well within the skill of those having ordinary skill in the art.

As discussed above, obtaining high positional accuracy (i.e., small positional resolution accuracy) with a single piece axis device requires that the entire axis be manufactured to extremely tight tolerances and this can often be expensive, particularly where large placement machines are involved. The present invention is directed to a means for using a conventional placement machine to achieve initial positioning of a component over a substrate within a first positional resolution accuracy and then using a second novel mechanism to slightly reposition the component to within a second positional resolution accuracy less than said first positional resolution accuracy prior to placing it by lowering it in the Z-direction. In this way, extremely high resolution can be achieved without fabricating the placement machine to extremely high tolerances.

Figure 4:
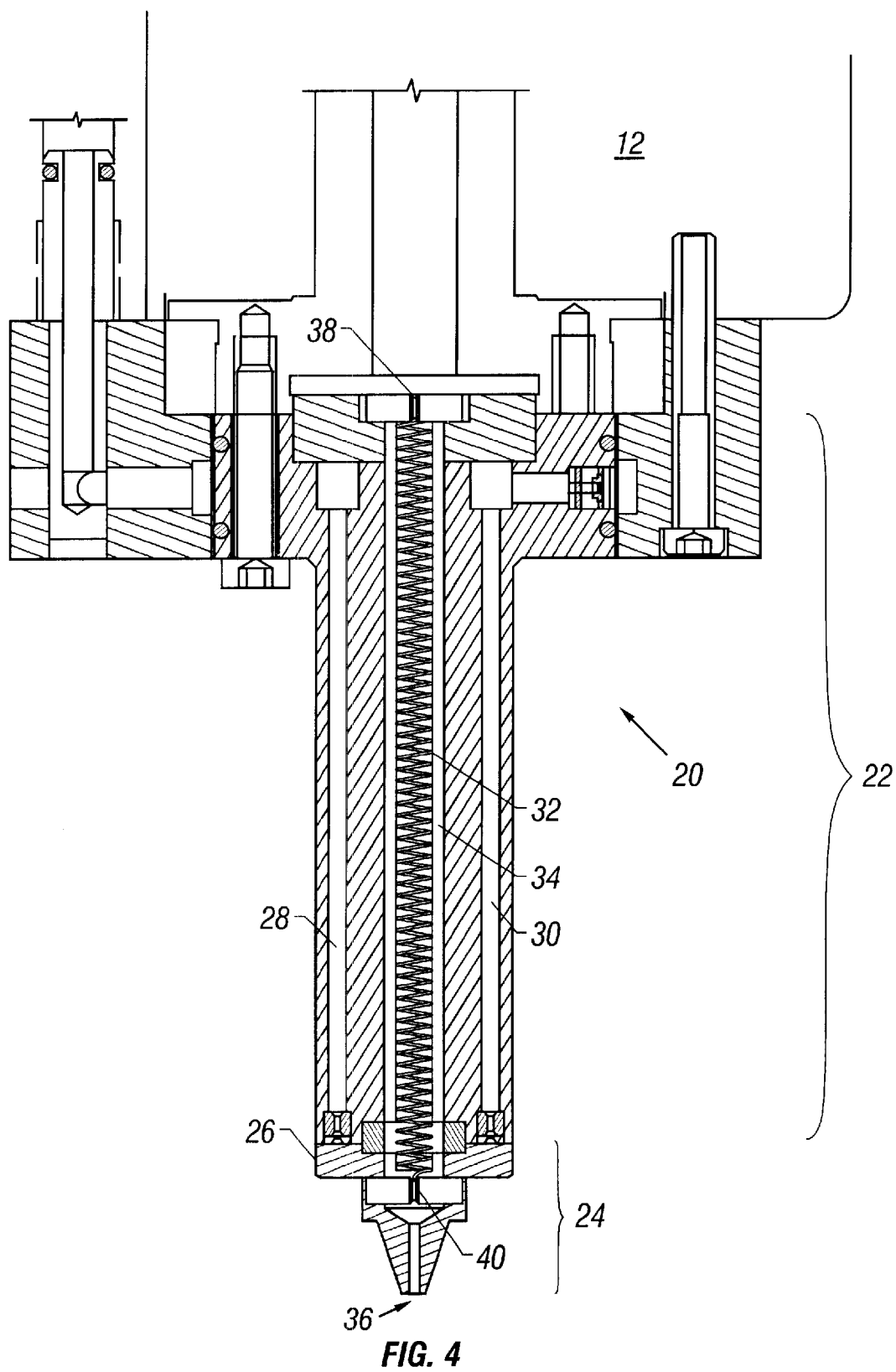
FIG. 4 is an elevational cross-sectional drawing of a pick-up head in accordance with a specific embodiment of the present invention.

Turning now to FIG. 4, an elevational cross-sectional drawing of a pick-up head 20 in accordance with a specific embodiment of the present invention is shown. Pick-up head 20 is preferably coupled to a Z/T stage 12 of a placement machine 10 as discussed above. Pick-up head 20 includes an upper body portion 22 and a lower body portion 24. Upper body portion 22 and lower body portion 24 are separated by an air bearing 26 that is active to create a near-frictionless bearing between upper body portion 22 and lower body portion 24 when air pressure is supplied via channels 28, 30. Pulling a vacuum through channels 28, 30 can lock lower body portion 24 to upper body portion 22 by eliminating the effectiveness of the air bearing. Biasing means 32 which may be a coil spring, an elastic band, or a similar device urges lower body portion 24 against upper body portion 22 and tends to center lower body portion 24 coaxially with upper body portion 22 when air pressure is supplied to air bearing 26. Biasing means 32 rides in vacuum channel 34 that supplies a source of vacuum to the vacuum pick-up nozzle 36 that may be used for component pick-up and retention. Cutting the vacuum supply releases the component. Biasing means 32 is mounted at one end 38 to upper body portion 22 and at its other end 40 to lower body portion 24. Biasing means 32 could also be an air supply, either positive pressure or vacuum urging lower body portion 24 against upper body portion 22 however the spring or elastic band approach is somewhat preferred because it also provides self-centering.

In operation, the pick-up head of FIG. 4 may be used to pick-up a component such as an electrical component to be soldered to a printed circuit board substrate. Vacuum is applied to channel 34 and the pick-up head is positioned over the component. The component is picked-up and transported to a first position located within a first positional resolution accuracy of a selected location for placement of the component. The pressure may be applied to the air bearing (the lower body portion having been pre-centered coaxially with the upper body portion). The component may then be lowered into contact with the substrate, the solder heated to reflow conditions, and the surface tension forces of the solder used to pull the part laterally into precise alignment with pre-fluxed pads of the PCB, the air bearing providing no appreciable resistance to this process.

Generally, it will be desirable to provide a "play" of at least about two times the first positional resolution accuracy between the lower body portion and the upper body portion so that all conditions may be dealt with.

Figure 5:
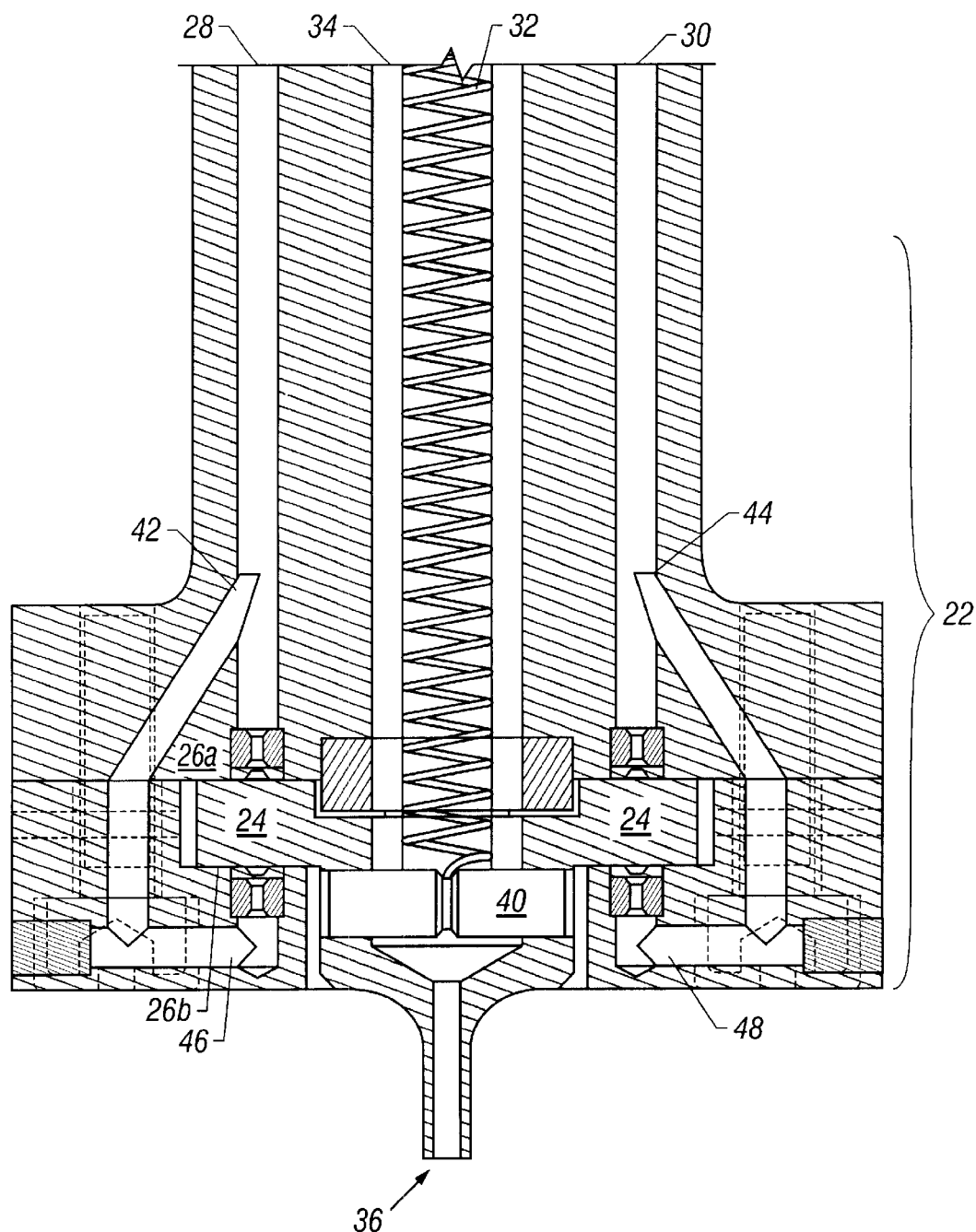
FIG. 5 is an elevational cross-sectional drawing of a pick-up head in accordance with another specific embodiment of the present invention.

Turning now to FIG. 5, an alternative specific embodiment of the pick-up head in accordance with a specific embodiment of the present invention is shown. The embodiment of the pick-up head of FIG. 5 differs from that of FIG. 4 in that the upper body portion 22 wraps around lower body portion 24 as shown to form two bearing surfaces: and upper bearing surface 26a and a lower bearing surface 26b. When air is supplied through channels 28 and 30 as before, these two bearing surfaces are pressurized and act as near-frictionless bearings. In this case channels 28 and 30 include wyes 42, 44, respectively, which, in turn feed channels 46, 48, respectively, which pressurize lower bearing surface 26b as shown. Biasing means 32 works as before to urge lower body portion 24 against upper body portion 22 as shown. In operation, the embodiment of FIG. 5 operates essentially the same as that of FIG. 4 except that the lower body portion is captured by the upper body portion in this embodiment.

Figure 6:
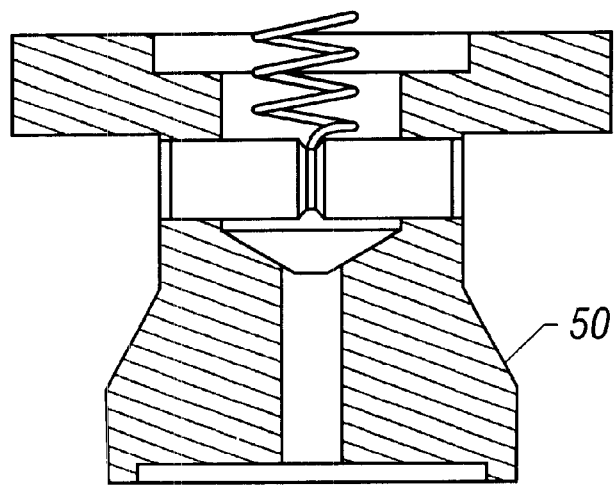
FIGS. 6 and 7 are elevational cross-sectional drawings of alternative vacuum nozzles for a pick-up head in accordance with a specific embodiment of the present invention.

Turning now to FIG. 6, an alternative vacuum nozzle 50 is shown which may be used with either the FIG. 4 or FIG. 5 embodiments of the pick-up head of the present invention.

Figure 7:
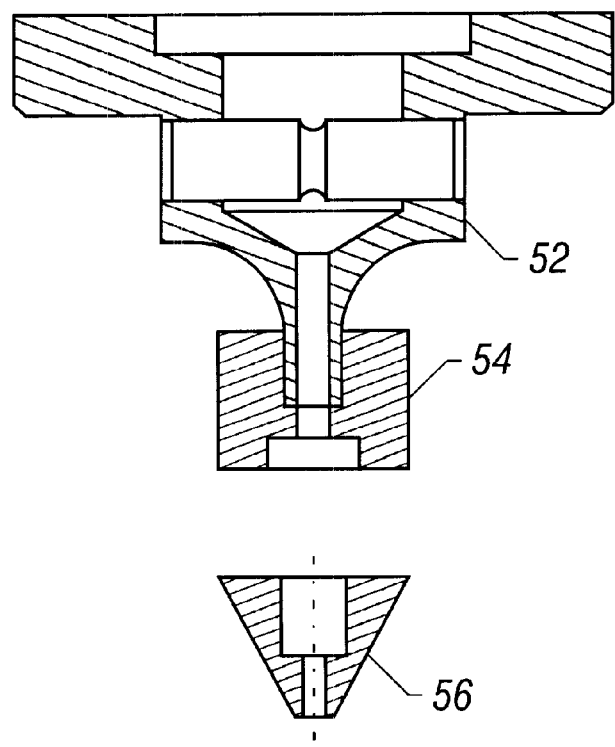

Turning now to FIG. 7, an alternative vacuum nozzle 52 is shown which may be used with either the FIG. 4 or FIG. 5 embodiments of the pick-up head of the present invention. Vacuum tip 54 or vacuum tip 56 may be attached to nozzle 52, as desired, or any other suitable design may be employed.

In accordance with one specific embodiment of the present invention, the lower body portion of the pick-up head may be micropositioned by one or more electrically controlled micropositioner elements. Thus, once the component is held in place and positioned in a first position to within a first positional resolution accuracy of a selected location on a substrate, the pick-up head lower body portion may be placed in its loose mode by pressurizing the air bearing(s) and moved to a more precise second position within a second positional resolution accuracy (less than said first positional resolution accuracy), the bearings depressurized place the lower body portion into its attached mode to lock in the positional setting, and the component lowered on the Z-stage down to the substrate for placement.

Figure 8:
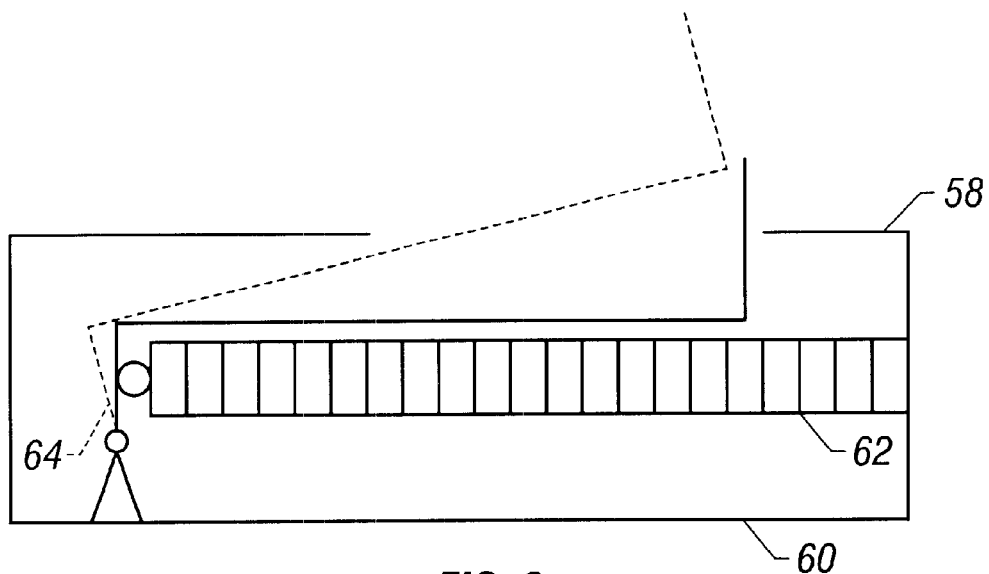
FIG. 8 is a schematic diagram of a piezo-electric stack-type micropositioning actuator in accordance with the prior art.

Turning now to FIG. 8, an example of a micropositioner element available, for example, from Adept Technologies of California, U.S.A., is illustrated. Many similar micropositioners are available and, depending upon the application, other technologies with higher or lower positional resolution accuracies may be used, the idea being that the micropositioner needs only to have a better positional resolution accuracy than the basic placement machine. Micropositioner element 58 is preferably contained in a housing 60 to which are mounted a piezo-electric disk stack 62 and a hinged actuator element 64. Application of a voltage to piezo-electric disk stack 62 changes the overall length of the stack in a manner well known to those of ordinary skill in the art. The application of this voltage in a controlled manner can now be easily tasked to computer 18. As stack 62 increases in length, hinged actuator element 64 moves from the position shown in solid line to the position shown in phantom line (the difference is somewhat exaggerated for effect). In this manner, small controlled voltage changes result in small excursions of actuator element 64 which can then be brought directly or indirectly in contact with lower body portion 24 of the pick-up head so as to move a component held by the pick-up head from a first position to a second position prior to changing the mode of the lower body portion from loose to attached.

Figure 9:
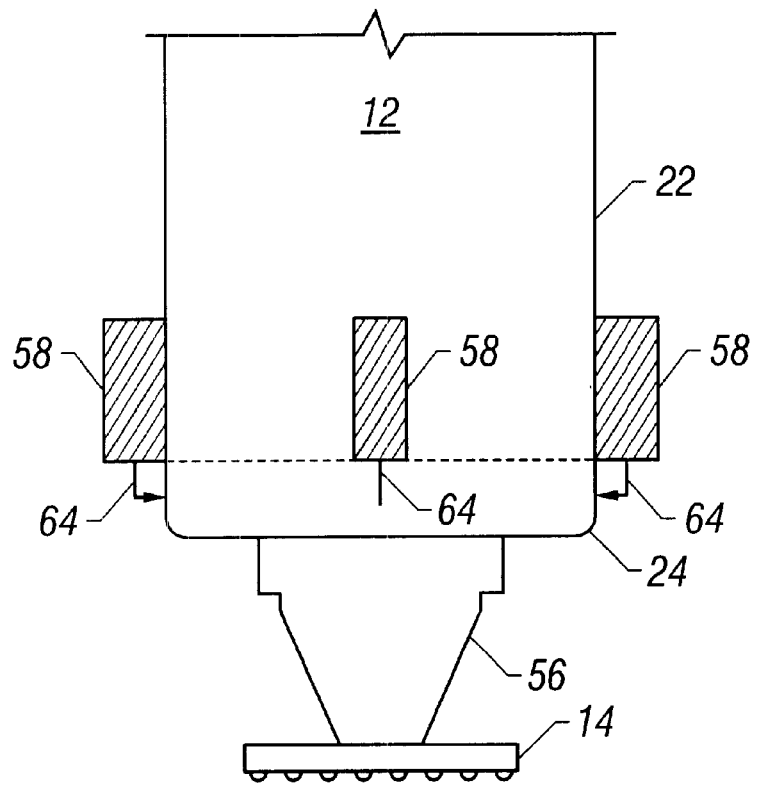
FIGS. 9 and 10 are diagrams illustrating the installation of micropositioning actuators on pick-up heads in accordance with specific embodiments of the present invention.

FIG. 9 illustrates a pick-up head 12 of the type illustrated in FIG. 4 equipped with micropositioner elements 58. The micropositioner elements are mounted to be carried with upper body portion 22 and their respective actuators 64 engage lower body portion 24 to move it when it is in its loose mode, thus repositioning a component 14 held by the nozzle tip 56 from a first position to a second position over the substrate.

Figure 10:
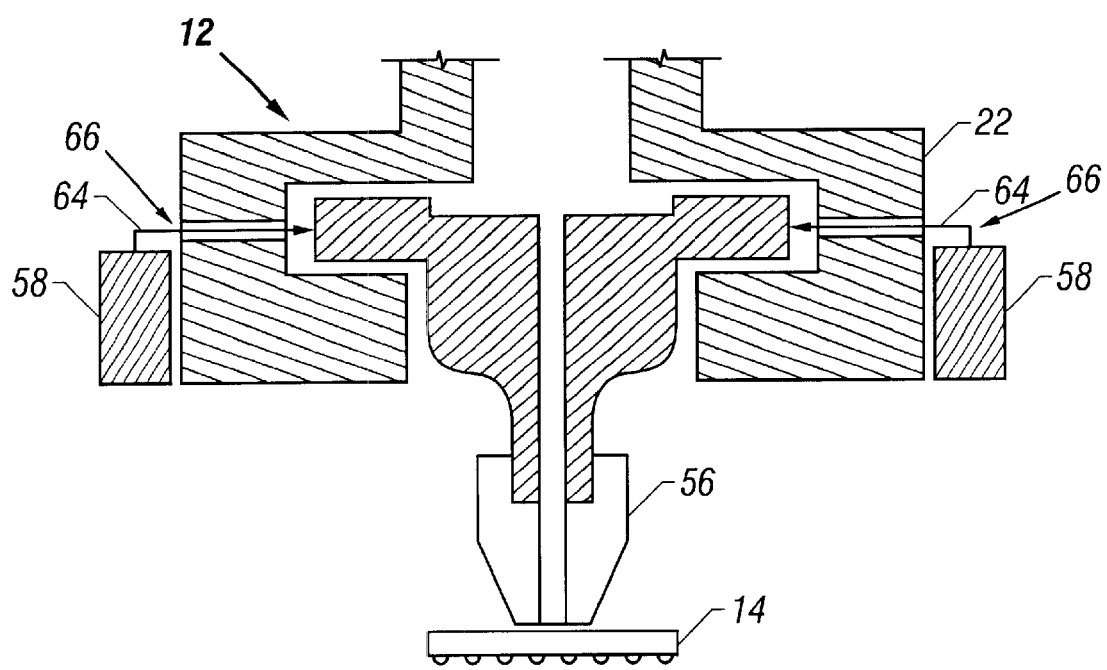

FIG. 10 illustrates a pick-up head 12 of the type illustrated in FIG. 5 equipped with micropositioner elements 58. The micropositioner elements are mounted to be carried with upper body portion 22 and their respective actuators 64 engage lower body portion 24 through channels 66 disposed through upper body portion 22 as shown to move lower body portion 24 when it is in its loose mode, thus repositioning a component 14 held by the nozzle tip 56 from a first position to a second position over the substrate.

Figure 11:
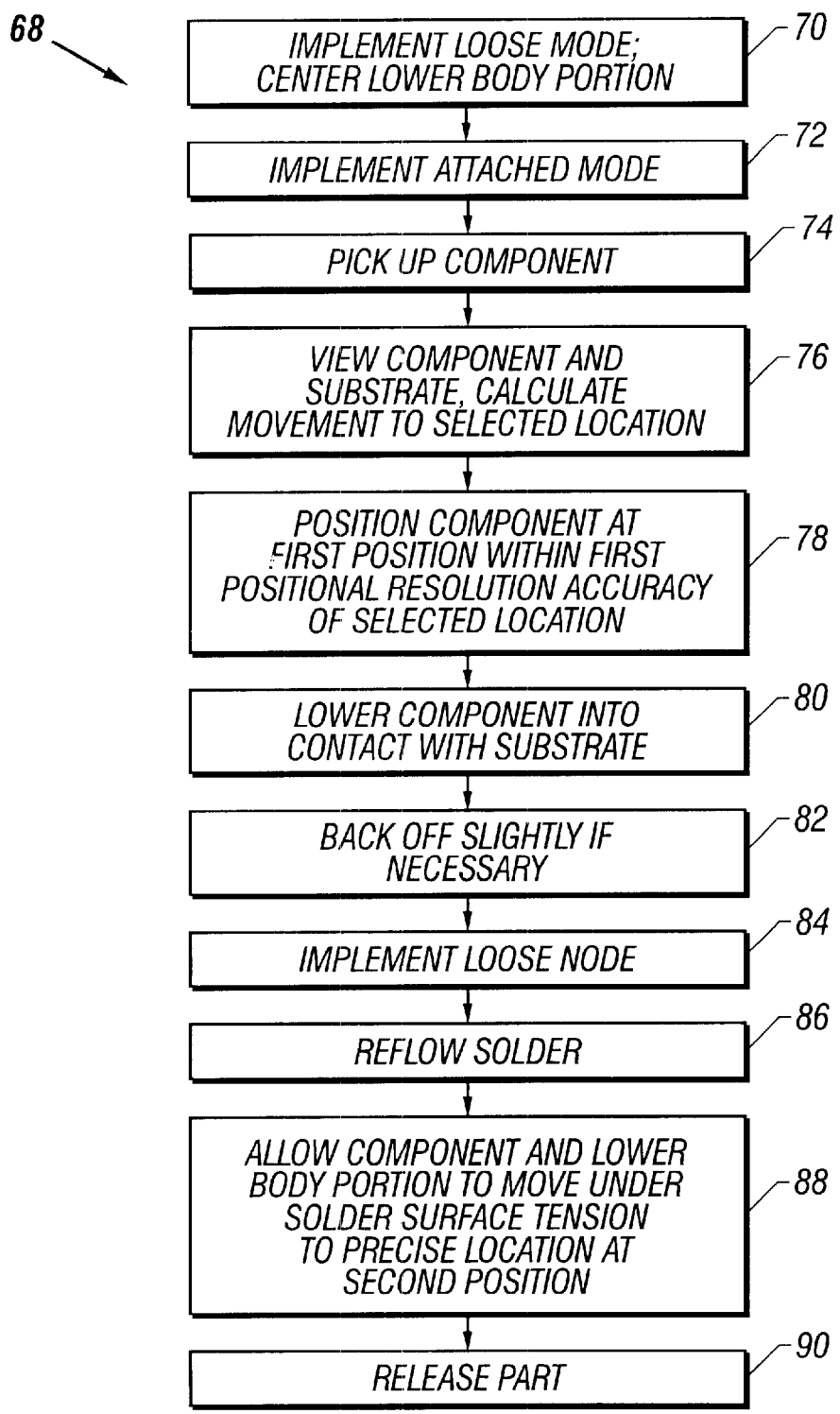
FIGS. 11 and 12 are process flow diagrams illustrating processes for high-resolution component attachment to a substrate in accordance with various specific embodiments of the present invention.

FIG. 11 is a process flow diagram illustrating a method 68 of high-resolution component attachment to a substrate in accordance with a specific embodiment of the present invention. In accordance with method 68, at block 70 the pick-up head is placed in its loose mode by supplying pressurized air to its air bearing(s). This automatically causes self-centering of the lower body portion to the upper body portion in embodiments employing a central biasing member 32. In other embodiments, a mechanical centering process will need to be employed. At block 72 attached mode is implemented by turning off the air pressure, collapsing the air bearing(s) and locking the lower body portion to the upper body portion by the action of biasing means 32. At block 74 the component is picked from a component store or feeder. At block 76 the component and substrate are imaged by a conventional machine vision system and movement necessary to place the component above the substrate within a first positional resolution accuracy of a selected location is calculated by computer 18 in a conventional manner. At block 78 the movement is carried out and the component is moved to a first position that is within the first positional resolution accuracy of the selected location. At block 80 the component is lowered with the Z-stage into contact with the substrate (contact being detected by a force sensor mounted with the Z-stage in a conventional manner). At block 82 the Z-stage is raised slightly, if necessary, to provide room for the air bearing(s) to inflate. At block 84 loose mode is implemented freeing the centered lower body portion to move in response to a supplied force. At block 86 the solder (in the case of electronic component placement to a substrate PCB) is reflowed by applying heat in a conventional manner. At block 88 the component and hence the lower body portion are pulled by the action of the surface tension of the molten solder into exact alignment at a second position within a second positional resolution accuracy of the selected location. At block 90 the part is released by releasing the gripper (for a vacuum gripper, one simply cuts off the vacuum supply to the nozzle). Note that other situations not involving solder can utilize this procedure where some terminal force acts to center the component toward the selected location. This would include mechanical parts fitting into mating receptacles on the substrate, and the like. The procedure is useful with any component placement or attachment to a substrate, as by soldering, welding, adhering, and the like.

Figure 12:
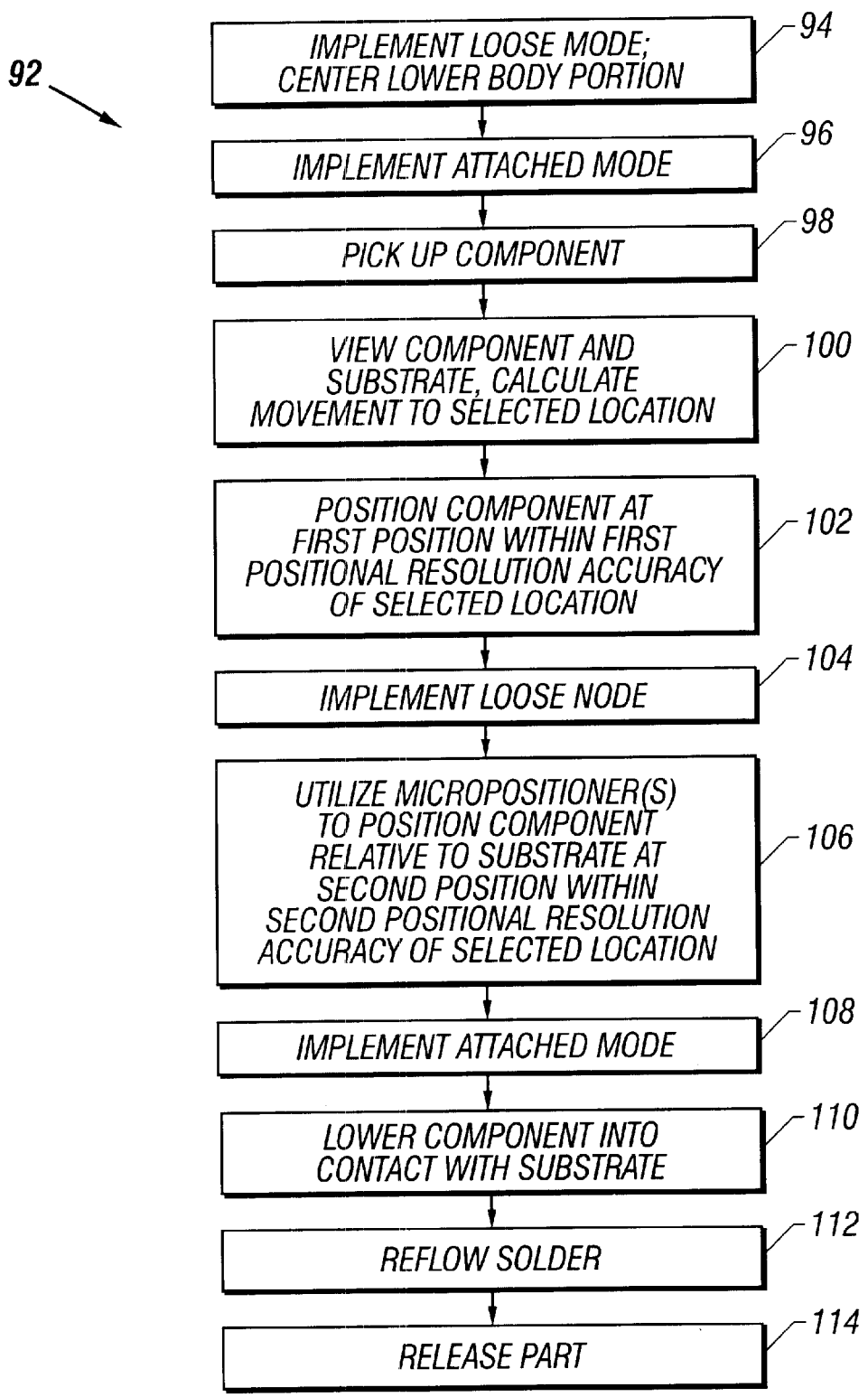

FIG. 12 is a process flow diagram illustrating a method 92 of high-resolution component attachment to a substrate in accordance with a specific embodiment of the present invention. In accordance with method 92, at block 94 the pick-up head is placed in its loose mode by supplying pressurized air to its air bearing(s). This automatically causes self-centering of the lower body portion to the upper body portion in embodiments employing a central biasing member 32. In other embodiments, a mechanical centering process will need to be employed. At block 96 attached mode is implemented by turning off the air pressure, collapsing the air bearing(s) and locking the lower body portion to the upper body portion by the action of biasing means 32. At block 98 the component is picked from a component store or feeder. At block 100 the component and substrate are imaged by a conventional machine vision system and movement necessary to place the component above the substrate within a first positional resolution accuracy of a selected location is calculated in a conventional manner by computer 18. At block 102 the movement is carried out and the component is moved to a first position that is within the first positional resolution accuracy of the selected location. At block 104 the loose mode is again implemented freeing the centered lower body portion to move in response to a supplied force. At block 106 one or more micropositioners are utilized to position the component relative to the substrate at a second position (above the substrate) within a second positional resolution accuracy of the selected location. At block 108 attached mode is again implemented to lock in the second position. At block 110 the component is lowered by the Z-stage into contact with the substrate at the second position. At block 112 the solder (in the case of electronic component placement to a substrate PCB) is reflowed by applying heat in a conventional manner. At block 114 the part is released by releasing the gripper (for a vacuum gripper, one simply cuts off the vacuum supply to the nozzle). Note that other situations not involving solder can utilize this procedure as well, for example the procedure is useful with any component placement or attachment to a substrate, as by soldering, welding, adhering, and the like.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A pick-up head for a placement machine, the pick-up head comprising:

an upper body;

a lower body;

a first air bearing disposed between a downward facing surface of said upper body and an upward facing surface of said lower body;

a first micropositioning actuator mounted to said upper body and positioned to move said lower body in a first direction relative to said upper body when said first micropositioning actuator is selectively activated;

biasing means for urging said lower body against said upper body so that when said air bearing is depressurized, said upper body and said lower body are in contact; and a gripper for gripping a component, the gripper fixed with said lower body.

2. An apparatus in accordance with claim 1 wherein said gripper is a vacuum gripper.

3. An apparatus in accordance with claim 2, further comprising:

a vacuum supply aperture disposed through said upper body and said lower body and communicating with said vacuum gripper.

4. An apparatus in accordance with claim 3, wherein said biasing means is a coil-type spring.

5. An apparatus in accordance with claim 3, wherein said biasing means is an elastic material.

6. An apparatus in accordance with claim 1, further comprising:

a second micropositioning actuator mounted to said upper body and positioned to move said lower body in a second direction relative to said upper body when said second micropositioning actuator is selectively activated.

7. An apparatus in accordance with claim 1, wherein:

said upper body extends around and beneath at least a portion of said lower body.

8. An apparatus in accordance with claim 7, further comprising:

a second air bearing disposed between an upward facing surface of said upper body and a downward facing surface of said lower body.

9. An apparatus in accordance with claim 1, wherein said biasing means is a coil-type spring.

10. An apparatus in accordance with claim 1, wherein said biasing means is an elastic material.

11. A pick-up head for a placement machine, the pick-up head comprising:
   an upper body;
   a lower body wherein said upper body extends around and beneath at least a portion of said lower body;
   a first air bearing disposed between a downward facing surface of said upper body and an upward facing surface of said lower body;
   a second air bearing disposed between an upward facing surface of said upper body and a downward facing surface of said lower body;
   biasing means for urging said lower body up against said upper body so that when said first and second air bearings are depressurized, said upper body and said lower body are in contact; and
   a gripper for gripping a component, the gripper fixed with said lower body.

12. An apparatus in accordance with claim 11, further comprising:
   a first micropositioning actuator mounted to said upper body and positioned to move said lower body in a first direction relative to said upper body.

13. An apparatus in accordance with claim 12, further comprising:
   a second micropositioning actuator mounted to said upper body and positioned to move said lower body in a second direction relative to said upper body.

14. A robotic placement machine for placing a component relative to a substrate, the robotic placement machine comprising:
   a pick-up head, the pick-up head being positionable in one or more directions to a first placement resolution, the pick-up head including
   an upper body;
   a lower body;
   a first air bearing disposed between a downward facing surface of said upper body and an upward facing surface of said lower body;
   a first micropositioning actuator mounted to said upper body and positioned to move said lower body in a first direction relative to said upper body when said first micropositioning actuator is selectively activated, the first micropositioner being positionable along said first direction to a second placement resolution, said second placement resolution being a higher placement resolution than said first placement resolution;
   biasing means for urging said lower body against said upper body so that when said air bearing is depressurized, said upper body and said lower body are in contact; and
   a gripper for gripping a component, the gripper fixed with said lower body.

15. An apparatus in accordance with claim 14 wherein said gripper is a vacuum gripper.

16. An apparatus in accordance with claim 15, further comprising:
   a vacuum supply aperture disposed through said upper body and said lower body and communicating with said vacuum gripper.

17. An apparatus in accordance with claim 16, wherein said biasing means is a coil-type spring.

18. An apparatus in accordance with claim 16, wherein said biasing means is an elastic material.

19. An apparatus in accordance with claim 14, further comprising:
   a second micropositioning actuator mounted to said upper body and positioned to move said lower body in a second direction relative to said upper body when said second micropositioning actuator is selectively activated, the second micropositioner being positionable along said second direction to a third placement resolution, said third placement resolution being a higher placement resolution than said first placement resolution.

20. An apparatus in accordance with claim 14, wherein:
   said upper body extends around and beneath at least a portion of said lower body.

21. An apparatus in accordance with claim 20, further comprising:
   a second air bearing disposed between an upward facing surface of said upper body and a downward facing surface of said lower body.

22. An apparatus in accordance with claim 14, wherein said biasing means is a coil-type spring.

23. An apparatus in accordance with claim 14, wherein said biasing means is an elastic material.

24. A robotic placement machine for placing a component relative to a substrate, the robotic placement machine comprising:
   a pick-up head, the pick-up head being positionable in one or more directions to a first placement resolution, the pick-up head including
   an upper body;
   a lower body wherein said upper body extends around and beneath at least a portion of said lower body;
   a first air bearing disposed between a downward facing surface of said upper body and an upward facing surface of said lower body;
   a second air bearing disposed between an upward facing surface of said upper body and a downward facing surface of said lower body;
   biasing means for urging said lower body up against said upper body so that when said first and second air bearings are depressurized, said upper body and said lower body are in contact; and
   a gripper for gripping a component, the gripper fixed with said lower body.

25. An apparatus in accordance with claim 24, further comprising:
   a first micropositioning actuator mounted to said upper body and positioned to move said lower body in a first direction relative to said upper body, the first micropositioner being positionable along said first direction to a second placement resolution, said second placement resolution being a higher placement resolution than said first placement resolution.

26. An apparatus in accordance with claim 25, further comprising:
   a second micropositioning actuator mounted to said upper body and positioned to move said lower body in a second direction relative to said upper body, the second micropositioner being positionable along said second direction to a third placement resolution, said third placement resolution being a higher placement resolution than said first placement resolution.

27. A method for positioning a component at a selected location relative to a substrate, the method comprising:
   picking up a component with a pick-up head having an upper body, a lower body and a first air bearing disposed between said upper body and said lower body, the pick-up head being positionable to within a first resolution accuracy of the selected location by a first mechanism;

moving the component relative to the substrate to a first position over the substrate disposed within a first resolution accuracy of the selected location;

pressurizing the air bearing;

offsetting the lower body by a distance necessary to position the component relative to the substrate to a second position over the substrate disposed within a second resolution accuracy of the selected location, the second resolution accuracy being less than the first resolution accuracy; and depressurizing the air bearing.

28. A method in accordance with claim 27, further comprising:

bringing the component into contact with the substrate at a location within the second resolution accuracy of the selected location.

29. A method in accordance with claim 28, wherein said picking up is performed with a vacuum nozzle.

30. A method in accordance with claim 28, further comprising:

releasing the component after brining it into contact with the substrate.

31. A method in accordance with claim 30, wherein said picking up is performed by applying vacuum to a vacuum nozzle and said releasing is performed by cutting vacuum to said nozzle.

32. A method for positioning a component at a selected location relative to a substrate, the method comprising:

means for picking up a component with a pick-up head having an upper body, a lower body and a first air bearing disposed between said upper body and said lower body, the pick-up head being positionable to within a first resolution accuracy of the selected location by a first mechanism;

means for moving the component relative to the substrate to a first position over the substrate disposed within a first resolution accuracy of the selected location;

means for pressurizing the air bearing;

means for offsetting the lower body by a distance necessary to position the component relative to the substrate to a second position over the substrate disposed within a second resolution accuracy of the selected location, the second resolution accuracy being less than the first resolution accuracy; and means for depressurizing the air bearing.

33. An apparatus in accordance with claim 32, further comprising:

means for bringing the component into contact with the substrate at a location within the second resolution accuracy of the selected location.

34. An apparatus in accordance with claim 33, wherein said means for picking up includes a vacuum nozzle.

35. An apparatus in accordance with claim 33, further comprising:

means for releasing the component after bringing it into contact with the substrate.

36. An apparatus in accordance with claim 35, wherein said means for picking up includes means for applying vacuum to a vacuum nozzle and said means for releasing includes means for cutting vacuum to said nozzle.

* * * * *

UNITED STATES PATENT AND TRADEMARK OFFICE
CERTIFICATE OF CORRECTION

PATENT NO. : 6,463,359 B2
DATED : October 8, 2002
INVENTOR(S) : Ernest H. Fischer It is certified that error appears in the above-identified patent and that said Letters Patent is hereby corrected as shown below:

Column 11,
Line 31, replace "A method" with -- an apparatus --.
Line 32, replace "method" with -- apparatus --.

Signed and Sealed this

Twenty-fifth Day of March, 2003

JAMES E. ROGAN
*Director of the United States Patent and Trademark Office*